(12) United States Patent
Oita

(10) Patent No.: US 7,352,256 B2
(45) Date of Patent: Apr. 1, 2008

(54) CRYSTAL OSCILLATION CIRCUIT

(75) Inventor: Takeo Oita, Sayama (JP)

(73) Assignee: Nihon Dempa Kogya Co., Ltd., Tokyo (JP)

( * ) Notice: Subject to any disclaimer, the term of this patent is extended or adjusted under 35 U.S.C. 154(b) by 14 days.

(21) Appl. No.: 11/447,695

(22) Filed: Jun. 6, 2006

(65) Prior Publication Data

US 2007/0063778 A1   Mar. 22, 2007

(30) Foreign Application Priority Data

Jun. 7, 2005  (JP) .............................. 2005-167531

(51) Int. Cl.
*H03B 5/32* (2006.01)
(52) U.S. Cl. .................. 331/158; 331/167; 331/116 R; 331/116 FE; 331/175
(58) Field of Classification Search ................ 331/158, 331/116 R, 116 FE, 167, 175, 751
See application file for complete search history.

(56) References Cited

U.S. PATENT DOCUMENTS 4,378,532 A    3/1983  Burgoon

FOREIGN PATENT DOCUMENTS

| JP | 58198904 A | 11/1983 |
| JP | 59047811 A | 3/1984 |
| JP | 07-007363 | 1/1995 |
| JP | 2000-295037 | 10/2000 |
| JP | 2002-261546 | 9/2002 |

OTHER PUBLICATIONS

"European Search Report for Application No. EP 06 11 4963", a corresponding patent application, 1 Page.
"Communication Pursuant to Article 96(2) EPC for corresponding EP Application No. 06114963.9-1233", (Feb. 27, 2007), 1 pg.
European Search Report for corresponding EP Application No. 06114963.9-1233 Including communication page, European Search Report page, Annex to European Search Report page, EPO Form 1703 two pages, 5 pages total.

*Primary Examiner*—Arnold Kinkead
(74) *Attorney, Agent, or Firm*—Schwegman, Lundberg & Woessner P.A.

(57) ABSTRACT

A crystal oscillation circuit can correctly suppress the resonance of a B mode, thereby correctly excite the resonance of a C mode. Since the crystal oscillation circuit uses a quartz oscillator of an SC cut or an IC cut, the B mode (unnecessary mode) frequency is close to the C mode (main mode) frequency. Therefore, a C mode resonance circuit (main mode resonance circuit) for passing a C mode frequency and a trap circuit for suppressing the oscillation at an unnecessary mode frequency are provided in the feedback loop of the crystal oscillation circuit.

7 Claims, 6 Drawing Sheets

CRYSTAL OSCILLATION CIRCUIT

This application claims priority under 35 U.S.C. 119 to Japanese Application No. 2005-167531, filed Jun. 7, 2005, which application is incorporated herein by reference and made a part hereof.

BACKGROUND OF THE INVENTION

1. Field of the Invention

The present invention relates to a crystal oscillation circuit, and more specifically to a technology of suppressing the unnecessary oscillation of a quartz oscillator.

2. Description of the Prior Art

Generally, a piezoelectric crystal used for a quartz oscillator can excite the piezoelectric oscillation only at a specific cutting angle for a crystallographic axis. SC-cut and IT cut quartz oscillators are well known as quartz oscillators appropriate for such an oscillator.

However, the SC-cut and II-cut quartz oscillators generate B mode and A mode secondary oscillation (unnecessary mode) near the resonance in the C mode (main mode) as primary oscillation, and at the high frequency side.

Since the value of the crystal impedance (hereinafter referred to as CI for short) at the oscillation in the A mode is larger than that in the C mode, no specific problem occurs. On the other hand, the CI in the B mode is equal to or sometimes smaller than the CI in the C mode. Therefore, when an oscillator is actually produced, there can be the problem that the oscillation is performed in the B mode as the secondary oscillation.

When a quartz oscillator of the SC cut or IT cut is used, it is necessary to suppress the oscillation in the B mode to correctly excite the primary oscillation in the C mode. To attain it, a crystal oscillation circuit for suppressing the secondary oscillation in the B mode has been proposed.

FIG. 1A shows a colpitts crystal oscillation circuit provided with a common B mode suppression circuit. It has the configuration of a serial resonance circuit (by the dotted lines) including an L (coil: inductance device) and a C (capacitor: capacitance device) tuned for the C mode to enable the negative resistance (NR) to have a frequency characteristic. FIG. 1B shows an equivalent circuit of the circuit shown in FIG. 1A. The condition of the colpitts oscillation circuit is that a signal passes in both directions to the resonance circuit (by dotted lines) inserted into the feedback loop of the circuit shown in FIG. 1A.

Thus, the colpitts oscillation circuit that suppresses B mode oscillation and stably oscillates the C mode inserts a serial resonance circuit that resonates at the frequency in the C mode to enable the feedback loop to have an optional frequency.

However, a circuit using a coil and a capacitor cannot positively suppress the oscillation in the B mode.

For example, although the selection characteristic depends on the Q value of a coil, the Q value is 50 at most in the case of a small SMD (surface mount device) type winding coil. Therefore, the B mode cannot be sufficiently suppressed. That is, there is the problem that the negative resistance at the frequency of the B mode in an oscillation circuit remains as the negative state.

For example, according to the Japanese Published Patent Application No. 2002-261546, when there is spurious at a frequency lower than a predetermined resonance frequency in a quartz oscillator incorporated into a crystal oscillation circuit, the oscillation occurs by the spurious. Therefore, a crystal oscillation circuit with suppressed spurious oscillation has been proposed.

Additionally, the Japanese Published Patent Application No. 2000-295037 also proposes the technology of making the absolute value of the negative resistance at the frequency in the B mode smaller than the effective resistance in the B mode while keeping the negative resistance at the frequency in the C mode by adding an inductance, variable reactance, and two chip capacities.

The Japanese Published Patent Application No. H7-7363 proposes the technology of providing an SC-cut quartz oscillator for suppressing spurious for a variation of a colpitts crystal oscillation circuit so that the negative resistance in the B mode can be adjusted by the resonance for the frequency in the B mode.

However, for the correct oscillation only in the C mode, it is necessary to make the negative resistance of the frequency in the B mode a positive value. In the method described in the above-mentioned patent document, it is not possible to make the negative resistance of the frequency in the B mode a positive value.

Furthermore, when a quartz oscillator is used as a trap circuit for a suppression circuit in the B mode as indicated by the Japanese Published Patent Application No. H7-7367, the negative resistance in the B mode can be made positive at an arrow frequency band indicated by the curve A shown in FIG. 2. However, as shown in FIG. 2, it is difficult to correctly make an adjustment because a positive value can be obtained only in a narrow bandwidth in the B mode (for example, 10.9 MHz). In addition, since a quartz oscillator is used, it is costly. Furthermore, the temperature characteristic in the B mode indicates a large variation depending on a temperature change. Therefore, it is difficult to stably apply it in a wide temperature range.

When a coil having a large Q value and a capacitor are used, it is hard to make an adjustment because the pass band width in the C mode is very narrow.

When a ceramic resonator is used, it is hard to make an adjustment because there is much spurious of the ceramic resonator itself.

SUMMARY OF THE INVENTION

The present invention has been developed to solve the above-mentioned problems, and aims at providing a crystal oscillation circuit for correct oscillation in the main mode by providing a resistance device in a trap circuit for suppressing the oscillation in an unnecessary mode of a quartz oscillator.

Since a crystal oscillation circuit as an aspect of the present invention is provided with an SC-cut, IT-cut quartz oscillator, etc., the B mode (unnecessary mode) frequency is close to the C mode (main mode) frequency.

Therefore, a C mode resonance circuit (main mode resonance circuit) for passing the C mode frequency and a trap circuit for suppressing the oscillation at the unnecessary mode frequency are provided in the feedback loop of the crystal oscillation circuit.

It is preferable to provide the trap circuit with a B mode resonance circuit for suppressing the oscillation at the B mode frequency, and a resistance device for adjusting the amount of trap in the B mode can be serially connected to the B mode resonance circuit.

Furthermore, the C mode resonance circuit and the B mode resonance circuit can be serial resonance circuits. The serial resonance circuits can also be LC filters. Furthermore, it is desired that the crystal oscillation circuit is a colpitts crystal oscillation circuit.

The crystal oscillation circuit as one of an aspect of the present invention is a colpitts crystal oscillation circuit having a quartz oscillator in which a main mode frequency is close to an unnecessary frequency using a crystal cutting method, and an amplification circuit, and includes: a main mode serial resonance circuit including an inductance device and a capacitance device in a feedback loop of the crystal oscillation circuit; and an unnecessary mode serial resonance circuit including an inductance device, a capacitance device, and a resistance device. Then, the serial resonance frequency of the main mode serial resonance circuit is set close to the oscillation frequency, and the serial resonance frequency of the unnecessary mode serial resonance circuit is set close to the unnecessary mode frequency, thereby suppressing the oscillation frequency in the unnecessary mode while maintaining the negative resistance in the C mode.

The crystal oscillation circuit as an aspect of the present invention has a quartz oscillator X1 and a transistor amplifier Tr1. The quartz oscillator X1 has at least, in series, a capacitor C1, capacitors C2 and C3 as divided capacities, and a resistance R3 as a feedback resistance connected between an emitter of the transistor amplifier Tr1 and the ground. In the feedback loop in the circuit, the unnecessary mode serial resonance circuit is constituted by a series of the coil L2, the capacitor C5, and the resistance R4 and connected between the emitter of the transistor amplifier Tr1 and the ground, the main mode serial resonance circuit is constituted by serially connecting the coil L1 and the capacitor C4 and inserted between the connection points of the emitter and the divided capacity capacitors C2 and C3, the unnecessary mode frequency of the unnecessary mode serial resonance circuit is set close to the oscillation frequency, and the main mode frequency of the main mode serial resonance circuit is set close to the oscillation frequency, thereby suppressing the oscillation at the unnecessary mode frequency.

Using resistance for an unnecessary mode, a crystal oscillator can be downsized, and a simpler adjustment can be made. In addition, since a general-purpose part having a no large Q value can be used, the productivity can be improved and the required cost can be reduced.

DESCRIPTION OF THE PREFERRED EMBODIMENTS

The details of the modes for embodying the present invention are explained below by referring to the attached drawings.

(Example of Circuit Configuration)

Figure 3:
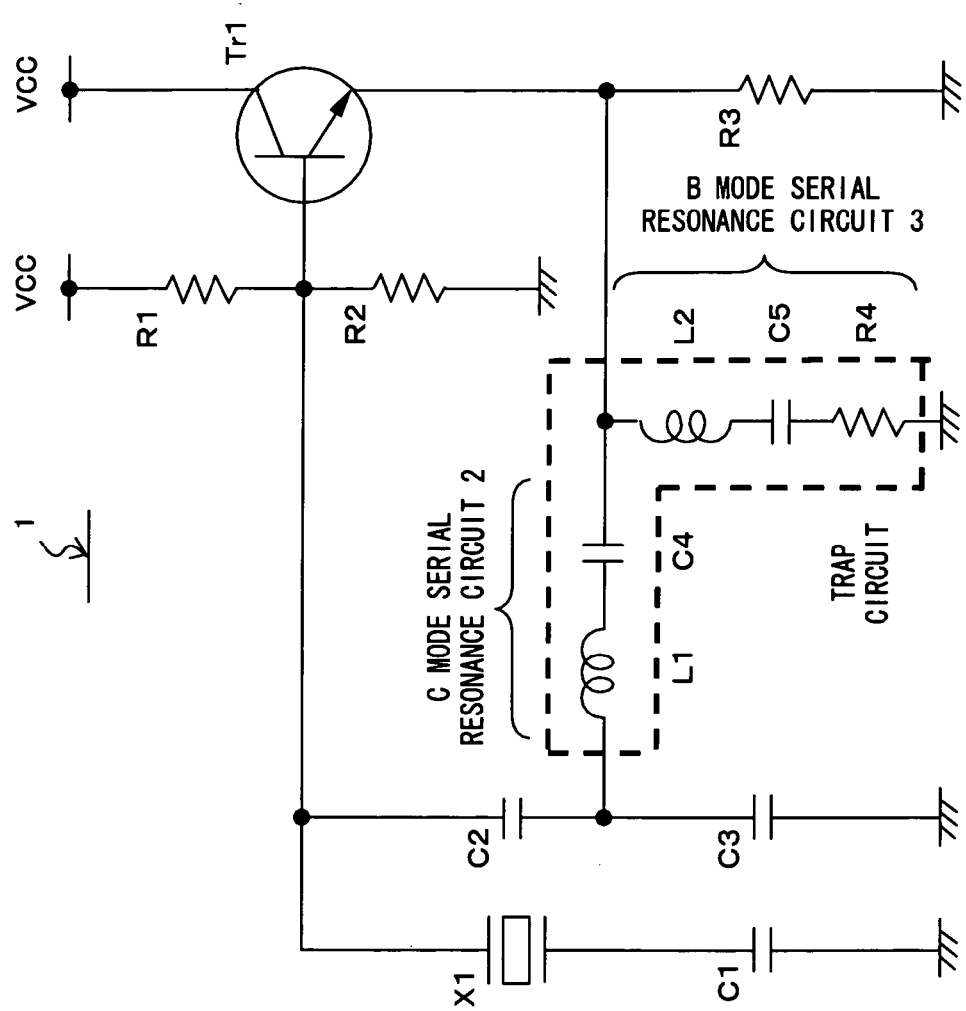
FIG. 3 shows the crystal oscillation circuit according to the present invention.

FIG. 3 shows an example of the crystal oscillation circuit according to the present invention. X1 shown in FIG. 3 is a quartz oscillator in which a C mode (main mode) frequency of an SC cut, an IT cut, etc. is close to a B mode (unnecessary mode) in the crystal cutting method.

One terminal of the quartz oscillator X1 is connected to a capacitance device C1, and the other terminal is connected to the base terminal of an amplifier (transistor amplifier) Tr1. Furthermore, the base terminal of the Tr1 is connected to one terminal of the resistance devices R1 and R2 and one terminal of a capacitance device C2.

Next, the emitter terminal of the amplifier Tr1 is connected to one terminal of the resistance device R3, the main mode resonance circuit, and the trap circuit.

The main mode resonance circuit is constituted by, for example, a serial connection of the inductance device L1 and the capacitance device C4. The terminal of the inductance device L1 is connected to the other terminal of the capacitance device C2 and one terminal of the capacitance device C3. With the above-mentioned configuration, a C mode frequency can be passed.

Then, the collector terminal of the amplifier Tr1 and the resistance device R1 are connected to a VCC (power supply). To the ground, the other terminals of capacitance devices C1 and C3 and the other terminals of the resistance devices R2, R3, and R4.

By inserting the trap circuit resonating with the feedback loop at the frequency in the B mode into the ground, the negative resistance around the B mode can be forcibly led in the positive direction.

Figure 1:
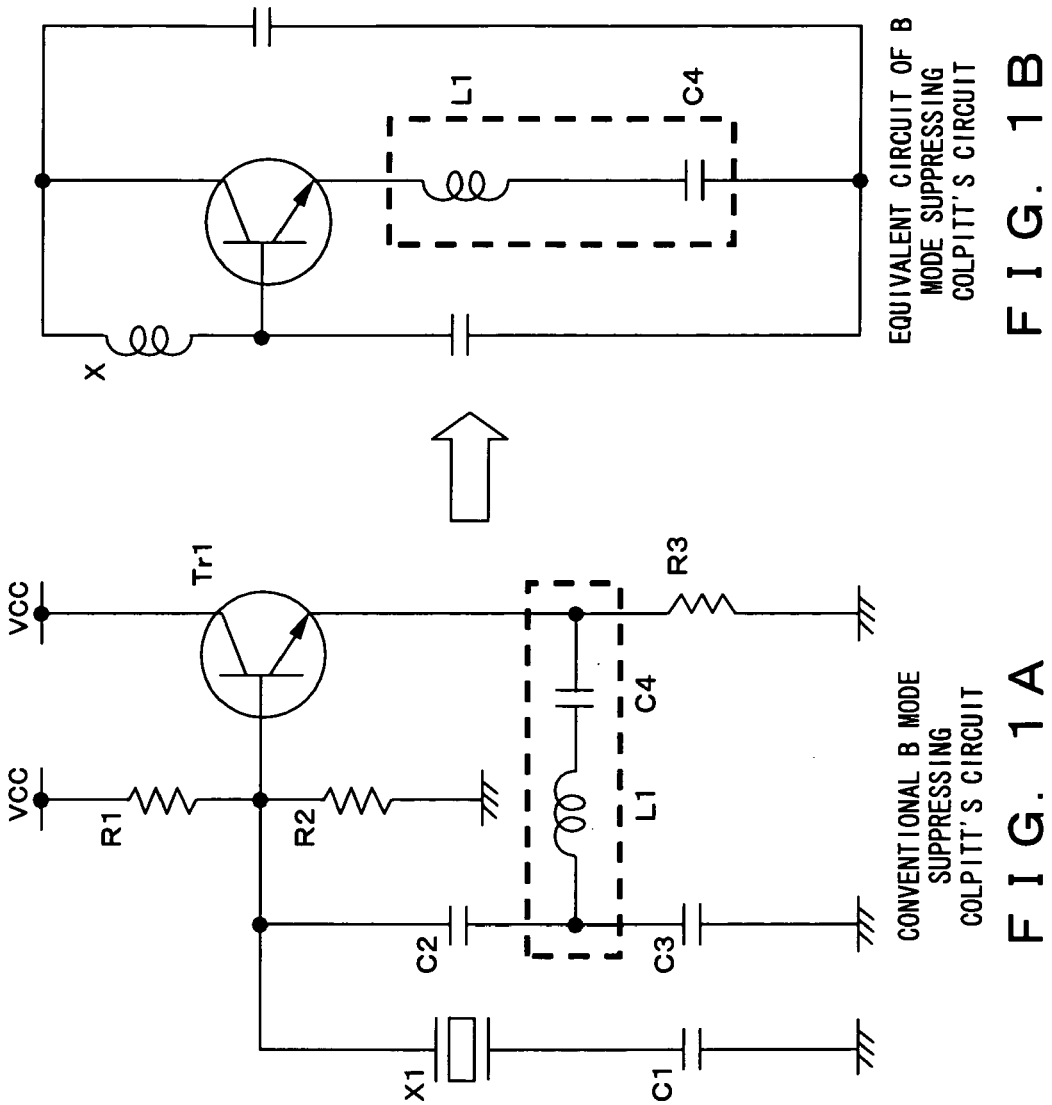
FIG. 1A shows the conventional colpitts oscillation circuit.
FIG. 1B shows an equivalent circuit shown in FIG. 1A.
Figure 2:
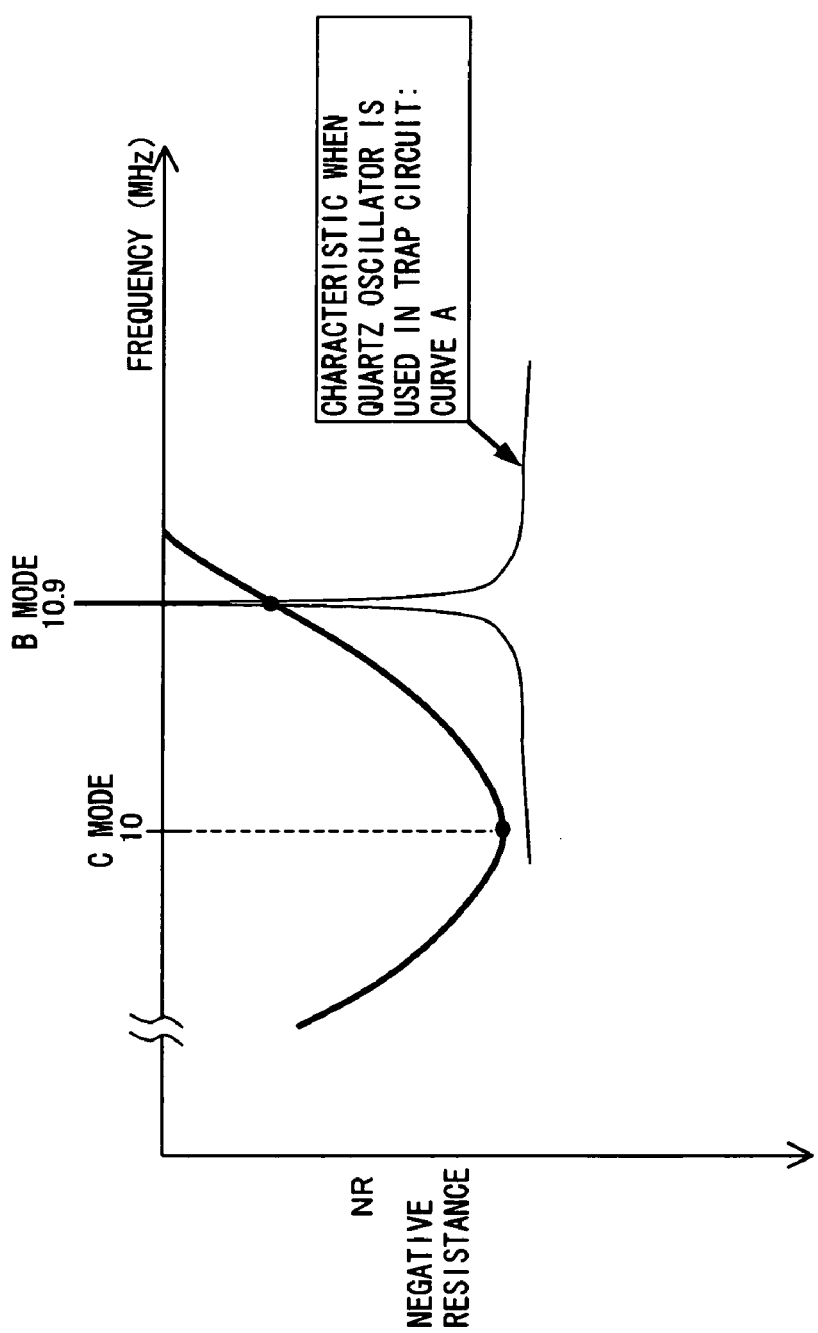
FIG. 2 shows an example using a quartz oscillator for a trap circuit.

For example, the B mode resonance circuit (unnecessary mode resonance circuit) is connected as a trap circuit shown in FIG. 2 to the conventional oscillation circuit. The B mode resonance circuit has a serial connection of the coil L2 and the capacitor C5, and the resistance R4. The terminals of the coil L2 and the capacitor C4 are connected to the circuit. This circuit lightly suppresses the negative resistance around the B mode to just enter a positive value, and trades off the influence to the negative resistance in the C mode.

FIG. 3 shows a practical example of a circuit of a feedback loop. The X1 uses a 10 MHz SC-cut quartz oscillator. The capacitor C1 is set to 81 pF, the resistance R1 is set to 10 kΩ, the resistance R2 is set to 10 kΩ. The capacitor C2 is set to 70 pF, and the capacitor C3 is set to 45 pF (the constants are not limited to these values).

Next, the coil L1 and the capacitor C4 of the serial resonance circuit for passing the C mode are respectively set to 10 mH and 26.9 pF, and the resistance in the coil L1 is set to 2 Ω.

Figure 4:
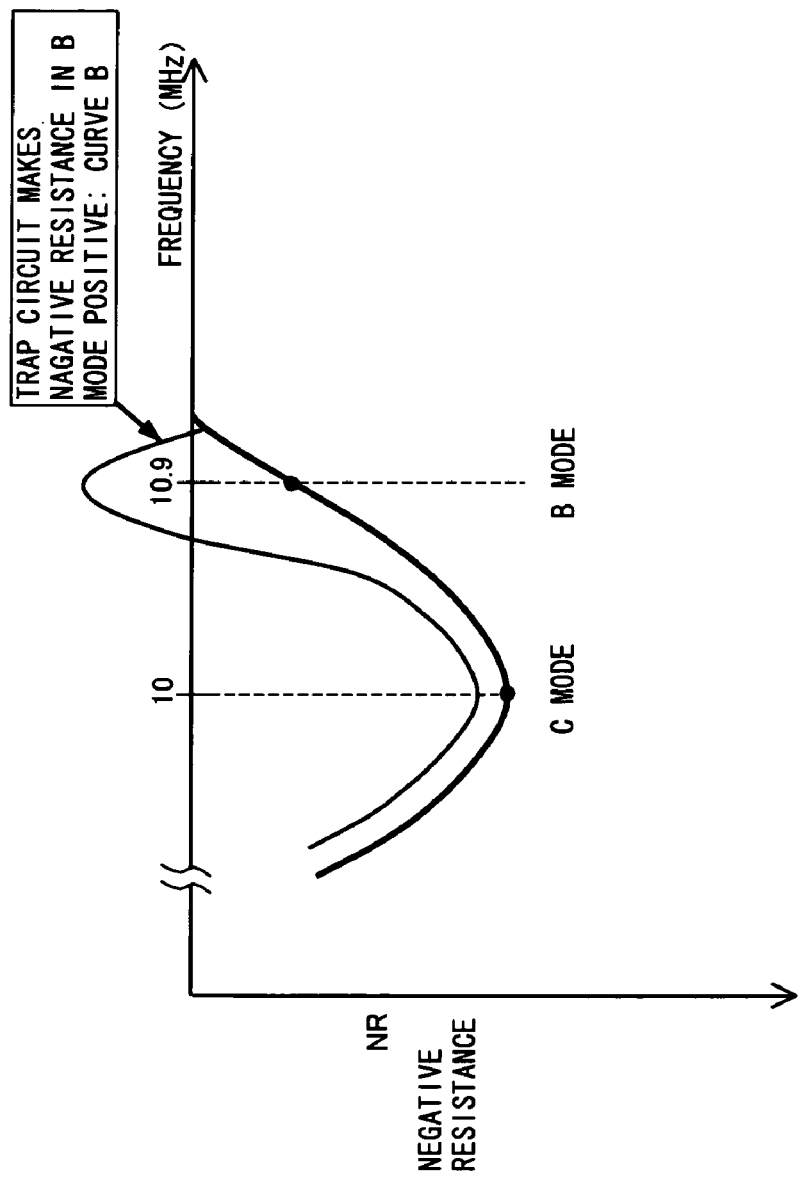
FIG. 4 shows the relationship between the negative resistance and the resonance frequency according to the present invention.

The coil L2 and the capacitor C5 forms a serial resonance circuit for positively suppressing the B mode. In this circuit, as indicated by the curve B shown in FIG. 4, the resistance value of the resistance R4 is increased or decreased, and the negative resistance in the C mode is protected from being lost to make the negative resistance in the B mode a positive value.

Furthermore, the main mode resonance circuit and the B mode resonance circuit can be not only an LC filter having the above-mentioned devices connected in series, but also a resonance circuit using a composite circuit including a parallel circuit.

(Analysis Result of Negative Resistance)

The frequency characteristic of the negative resistance of the oscillation circuit shown in FIG. 3 is analyzed, and the behavior of the B mode suppression is confirmed.

Figure 5:
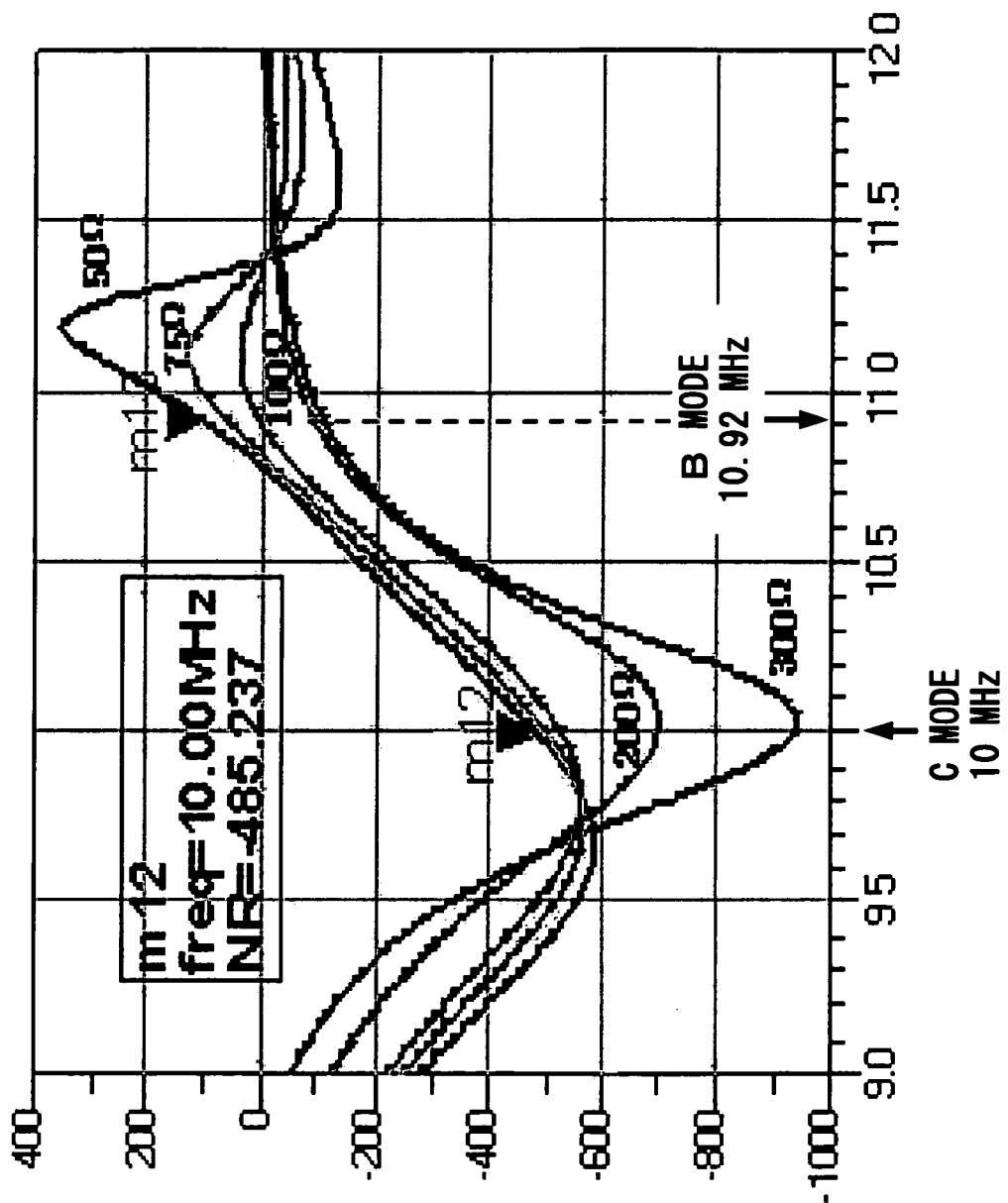
FIG. 5 shows a result of an analysis of the movement of the negative resistance when a resistance value is changed.

FIG. 5 shows the result of analyzing the change in the frequency characteristic of the negative resistance when the resistance R4 shown in FIG. 3 is changed to 300 Ω, 200 Ω, 100 Ω, 75 Ω, and 50 Ω. The vertical axis shows the negative resistance, and the horizontal axis shows the frequency. The C mode frequency of the quartz oscillator X1 is set to 10.0 MHz, and the B mode frequency is 10.92 MHz.

In this circuit, when there is only a C mode serial resonance circuit, the negative resistance is about −122 Ω at the B mode point, and there is the possibility that oscillation occurs for the CI value (about 48 Ω) in the B mode.

When the R4 is gradually decreased from 300 Ω, the negative resistance in the C mode also decreases while the suppression effect in the B mode becomes conspicuously large. The negative resistance in the B mode (10.92 MHz) becomes zero (0) at the point of 100 Ω. At the point of 50 Ω, the B mode is +101 Ω (m 13), and the C mode is 485 ohm (m 12).

The CI in the C mode is about 69 Ω at 10 MHz. Therefore, a seven times larger value is indicated, thereby providing a sufficient oscillation allowance.

(Oscillation Activation Condition)

The oscillation condition in the C mode is that the phase is set to zero (0) for a predetermined frequency in the C mode, the feedback gain of the feedback loop>1 is satisfied, and at the frequency in the B mode, any of the oscillation condition in the C mode is not satisfied.

Figure 6:
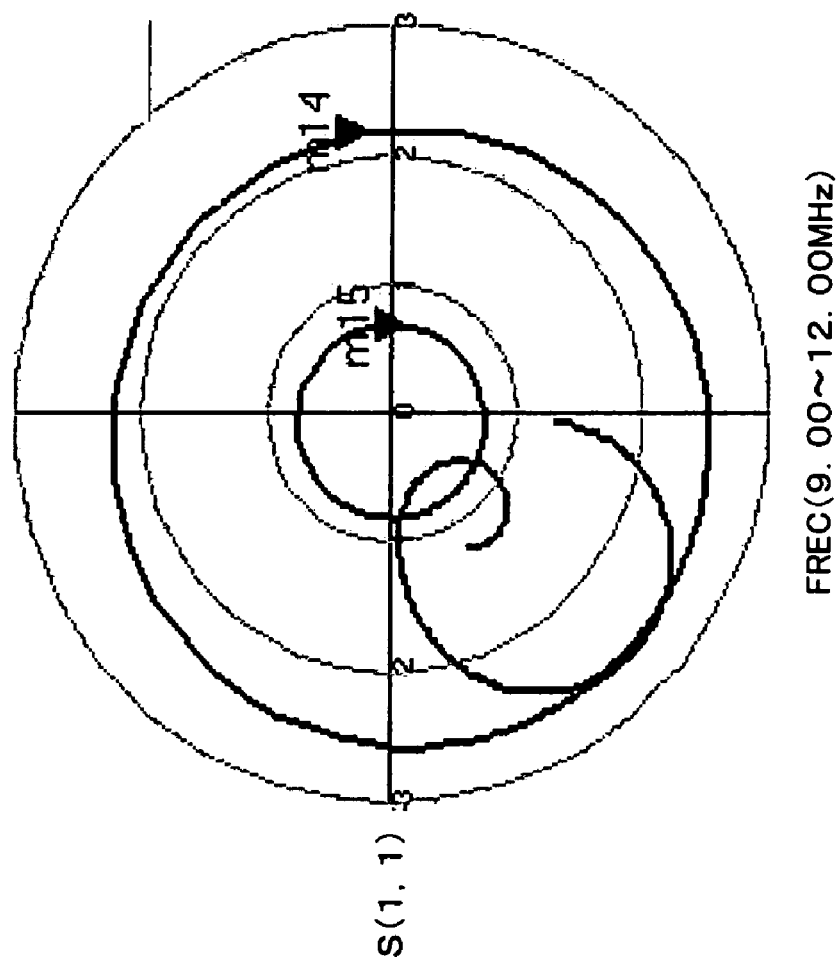
FIG. 6 shows the oscillation condition.

FIG. 6 shows the small-signal analysis of the output of an oscillation circuit, and displays the polar coordinates of the S11 characteristic (reflection characteristic).

The X axis shows a feedback gain, and indicates the phase rotation direction in the counterclockwise direction of the perimeter. The outer circle is the resonant portion, and is a phase rotation portion.

The marker m14 shows the oscillation condition in the C mode, and the feedback gain at the point of phase zero (0) is about 2.2 and satisfies the oscillation condition.

The inner small circle is a resonant portion in the B mode. The marker m15 shows the oscillation condition in the B mode, the gain is about 0.7, and does not satisfy the oscillation condition.

The locus in the third quadrant indicates the behavior of the resonant portion of a feedback loop, and there is no point that satisfies the oscillation condition on the perimeter. Therefore, the B mode oscillation can be suppressed, and the oscillation can be stably activated in the C mode.

Furthermore, when the negative resistance of the oscillation circuit becomes equal to the equivalent serial resistance including the quartz oscillator and the load capacity, a steady state can be entered, the oscillation activation is completed. The equivalent serial resistance obtained by composing the quartz oscillator used in a circuit example and the load capacity enters a steady state with 104 Ω.

The present invention is not limited to the above-mentioned modes for embodying the invention, but can be improved or changed in various manners within the scope of the gist of the present invention.

What is claimed is:

1. A crystal oscillation circuit using a quartz oscillator in which an unnecessary mode frequency is close to a main mode frequency in a crystal cutting method, comprising:

a main mode resonance circuit for passing the main mode frequency, and a trap circuit for suppressing the oscillation at the unnecessary mode frequency in a feedback loop of the crystal oscillation circuit; and a trap circuit having an unnecessary mode resonance circuit for suppressing the oscillation at the unnecessary mode frequency, in which the unnecessary mode resonance circuit is serially connected to a resistance device for adjusting an amount of trap in the unnecessary mode.

2. The circuit according to claim 1, wherein the main mode resonance circuit and the unnecessary mode resonance circuit are serial resonance circuits.

3. The circuit according to claim 2, wherein the serial resonance circuit is an LC filter.

4. The circuit according to claim 1, wherein
the crystal oscillation circuit is a colpitts crystal oscillation circuit.

5. A colpitts crystal oscillation circuit having a quartz oscillator in which a main mode frequency is close to an unnecessary frequency using a crystal cutting method, and an amplification circuit, comprising:

a main mode serial resonance circuit comprising an inductance device and a capacitance device in a feedback loop of the crystal oscillation circuit; and an unnecessary mode serial resonance circuit comprising an inductance device, a capacitance device, and a resistance device, wherein a serial resonance frequency of the main mode serial resonance circuit is set close to an oscillation frequency, and a serial resonance frequency of the unnecessary mode serial resonance circuit is set close to an unnecessary mode frequency, thereby suppressing an oscillation frequency in the unnecessary mode by a resistance value of the resistance device.

6. A colpitts crystal oscillation circuit having a quartz oscillator X1 and a transistor amplifier Tr1 in which the quartz oscillator X1 has at least, in series, a capacitor C1, capacitors C2 and C3 as divided capacities, and a resistance R3 as a feedback resistance connected between an emitter of the transistor amplifier Tr1 and the ground, wherein:

in a feedback loop, an unnecessary mode serial resonance circuit is constituted by a series of a coil L2, a capacitor C5, and a resistance R4 and connected between the emitter of the transistor amplifier Tr1 and the ground;

a main mode serial resonance circuit is constituted by serially connecting a coil L1 and a capacitor C4 and inserted between connection points of the emitter and the divided capacity capacitors C2 and C3;

the unnecessary mode frequency of the unnecessary mode serial resonance circuit is set close to the oscillation frequency, and the main mode frequency of the main mode serial resonance circuit is set close to the oscillation frequency, thereby suppressing oscillation at the unnecessary mode frequency.

7. The crystal oscillation circuit according to claim 5, wherein the serial resonance circuit is an LC filter.

* * * * *